(12) United States Patent
Suzuki

(10) Patent No.: US 9,465,134 B2
(45) Date of Patent: Oct. 11, 2016

(54) GEOMAGNETIC SENSOR

(75) Inventor: Toshikazu Suzuki, Tokyo (JP)

(73) Assignee: JAPAN AVIATION ELECTRONICS INDUSTRY, LIMITED, Tokyo (JP)

( * ) Notice: Subject to any disclaimer, the term of this patent is extended or adjusted under 35 U.S.C. 154(b) by 163 days.

(21) Appl. No.: 14/350,433

(22) PCT Filed: Jul. 11, 2012

(86) PCT No.: PCT/JP2012/067709
§ 371 (c)(1),
(2), (4) Date: Apr. 8, 2014

(87) PCT Pub. No.: WO2013/080601
PCT Pub. Date: Jun. 6, 2013

(65) Prior Publication Data
US 2014/0253113 A1    Sep. 11, 2014

(30) Foreign Application Priority Data

Nov. 30, 2011  (JP) ................. 2011-262486

(51) Int. Cl.
*G01R 33/02* (2006.01)
*G01V 3/40* (2006.01)
(Continued)

(52) U.S. Cl.
CPC .............. *G01V 3/40* (2013.01); *G01C 17/30* (2013.01); *G01R 33/028* (2013.01); *G01R 33/04* (2013.01)

(58) Field of Classification Search
CPC .. G01R 19/0092; G01R 15/18; G01R 15/20; G01R 15/148; G01R 15/183; G01R 15/207; G01R 19/20; G01R 33/02; G01R 33/09; G01R 19/00; H01F 38/28; H01F 38/32
USPC ............ 324/244–252, 260, 344, 127, 117 R, 324/117 H, 713
See application file for complete search history.

(56) References Cited

U.S. PATENT DOCUMENTS 3,260,930 A    7/1966   Kawada
3,421,074 A *  1/1969   Geyger ................ G01R 33/045
                                                   324/254

(Continued)

FOREIGN PATENT DOCUMENTS

DE    1208002    12/1965
DE    1441177    9/1969
(Continued)

OTHER PUBLICATIONS

Toshikatsu Sonoda et al. ("A Current Sensor of High Response and High Sensitivity", Conference Record of the Industry Applications Society Annual Meeting. Seattle, Oct. 7 12, 1998; [Conference Record of the Industry Applications Society Annual Meeting], New York, IEEE, US, vol. Meeting 25, Oct. 7, 1998 (1998-18-87), pp. 626-631.*

(Continued)

*Primary Examiner* — Son Le
(74) *Attorney, Agent, or Firm* — Greenblum & Bernstein, P.L.C.

(57) ABSTRACT

A geomagnetic sensor includes: a core that constitutes a closed magnetic circuit; a pair of coils that are wound around the core in positions facing each other and are connected in series to generate magnetic flux in the same circumferential direction in the core; an excitation power supply that applies an alternating current with a superimposed direct current to the pair of coils; and a detection circuit that is connected to a connection point of the pair of coils. Unlike a conventional flux gate type geomagnetic sensor, it is not required to excite the core until the core is magnetically saturated, and it is therefore possible to reduce power consumption.

9 Claims, 4 Drawing Sheets

(51) Int. Cl.
*G01R 33/028* (2006.01)
*G01R 33/04* (2006.01)
*G01C 17/30* (2006.01)

(56) References Cited

U.S. PATENT DOCUMENTS

| | | | |
|---|---|---|---|
| 3,731,752 | A | 5/1973 | Schad |
| 3,829,894 | A | 8/1974 | Watanabe et al. |
| 5,091,697 | A | 2/1992 | Roth et al. |
| 5,530,252 | A * | 6/1996 | Petric .................. H01J 37/1471 250/396 ML |
| 6,194,897 | B1 | 2/2001 | Fukunaga |
| 6,984,979 | B1 * | 1/2006 | Edel ..................... G01R 15/185 324/253 |

FOREIGN PATENT DOCUMENTS

| | | |
|---|---|---|
| JP | 58-180964 | 10/1983 |
| JP | 2000-028695 | 1/2000 |
| JP | 2005-315812 | 11/2005 |
| JP | 2009-092381 | 4/2009 |

OTHER PUBLICATIONS

Extended European Search Report, mailed Oct. 16, 2015, from the European Patent Office (E.P.O.) in the corresponding European Patent Application No. 12854399.8.

\* cited by examiner

GEOMAGNETIC SENSOR

TECHNICAL FIELD

The present invention relates to a geomagnetic sensor that measures the earth magnetism.

BACKGROUND ART

Conventionally, as a geomagnetic sensor that measures the earth magnetism, a flux gate type (FG type) geomagnetic sensor is known widely (for example, refer to Patent Literature 1).

Although being capable of high precision measurement of the earth magnetism, the flux gate type geomagnetic sensor has a problem in that, because a core with an exciting coil wound therearound has to be magnetically saturated with an AC current, namely an alternating current, the excitation current increases and power consumption is large.

PRIOR ART LITERATURE

Patent Literature

Patent literature 1: Japanese Patent Application Laid Open No. 2009-92381

SUMMARY OF THE INVENTION

Problems to be Solved by the Invention

It is an object of the present invention is to provide a geomagnetic sensor being capable of reducing power consumption.

Means to Solve the Problems

According to the present invention, a geomagnetic sensor includes: a core that constitutes a closed magnetic circuit; two coils that are wound around the core in positions facing each other and are connected in series to generate magnetic flux in the same circumferential direction in the core; an excitation power supply that applies an alternating current (AC) with a superimposed direct current (DC) to the two coils; and a detection circuit that is connected to a connection point of the two coils.

Effects of the Invention

According to the present invention, unlike a conventional flux gate type geomagnetic sensor, it is not required to excite a core until the core is magnetically saturated, that is, without magnetically saturating the core, it is possible to measure the earth magnetism with high precision, and it is therefore possible to reduce power consumption compared with the conventional sensors.

DETAILED DESCRIPTION OF THE EMBODIMENTS

Descriptions are given below to embodiments of the present invention.

Figure 1:
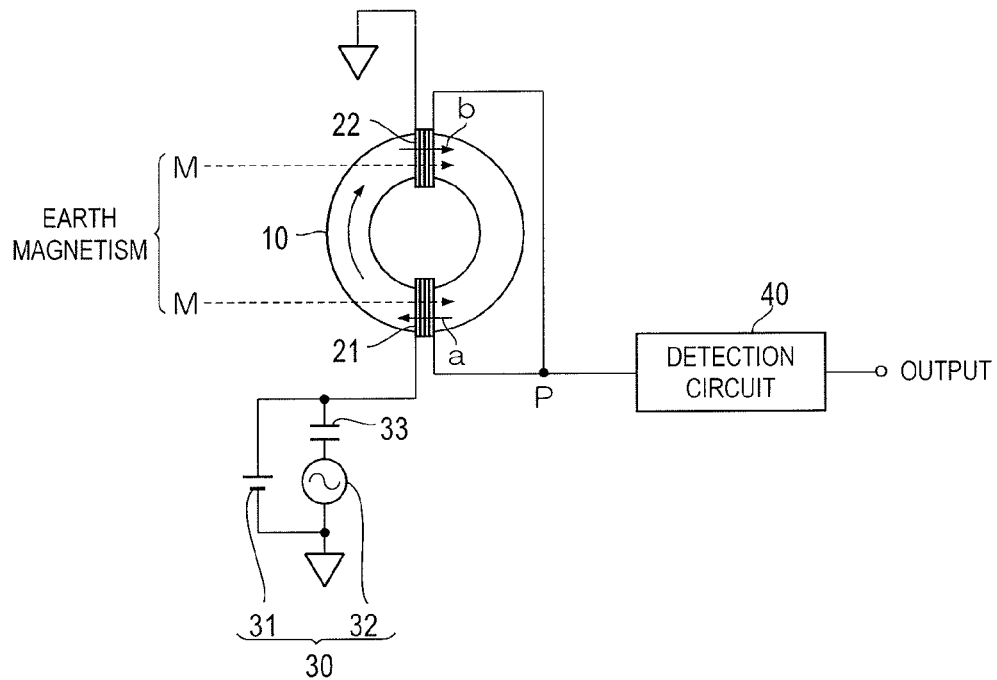
FIG. 1 is a diagram schematically illustrating a configuration in a first embodiment of a geomagnetic sensor according to the present invention.
Figure 2:
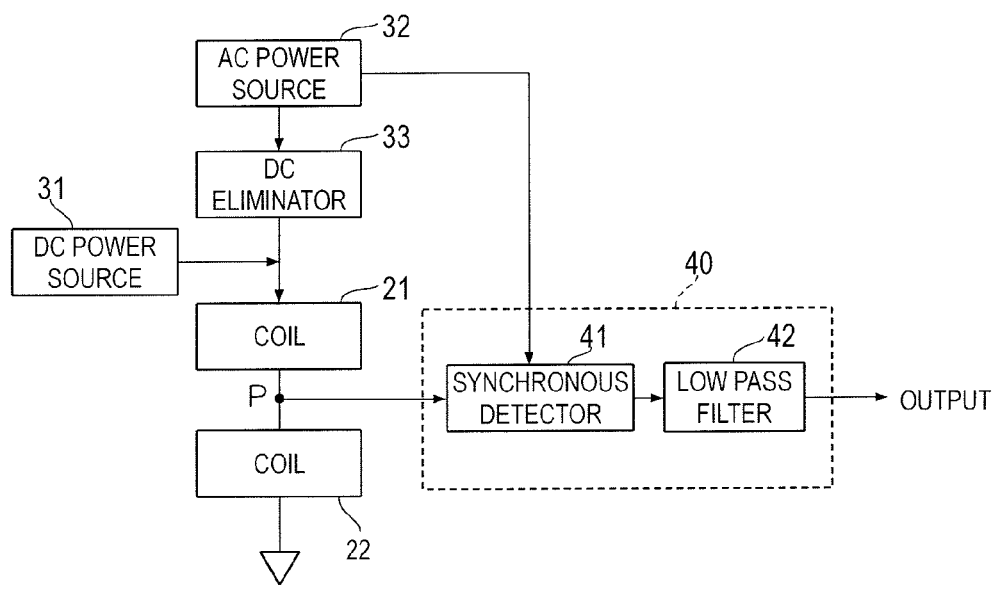
FIG. 2 is a block diagram illustrating a functional configuration in the first embodiment of a geomagnetic sensor according to the present invention.

FIG. 1 schematically illustrates a configuration in a first embodiment of a geomagnetic sensor according to the present invention, and FIG. 2 illustrates a functional configuration of the geomagnetic sensor illustrated in FIG. 1 as a block diagram.

A core 10 constituting a closed magnetic circuit is made of a highly permeable magnetic material, such as permalloy; the core is assumed to be a toroidal core in this case. Coils 21, 22 are wound around the core 10 in positions facing each other with the coil axial centers parallel to each other. The coils 21, 22 are wound around in the same direction viewed from the center of the core 10, and are connected in series to generate two pieces of magnetic flux in the same circumferential direction in the core 10 when a current is applied to the coils 21, 22.

To one end of the one coil 21, an excitation power supply 30 is connected. The excitation power supply 30 includes a DC (direct current) power supply 31 and an AC (alternating current) power supply 32, and is capable of applying an AC current with a superimposed DC current to the coils 21, 22. In FIG. 1, 33 denotes a DC eliminator (capacitor).

A DC current is applied to the coils 21, 22 by the DC power supply 31, which generates two pieces of DC magnetic flux in the core 10. In FIG. 1, arrows a, b exemplify respective directions of the two pieces of magnetic flux generated by the coils 21 and 22, and the directions of the two pieces of magnetic flux generated by the coils 21 and 22 are the same in the circumferential direction of the core 10.

Figure 3:
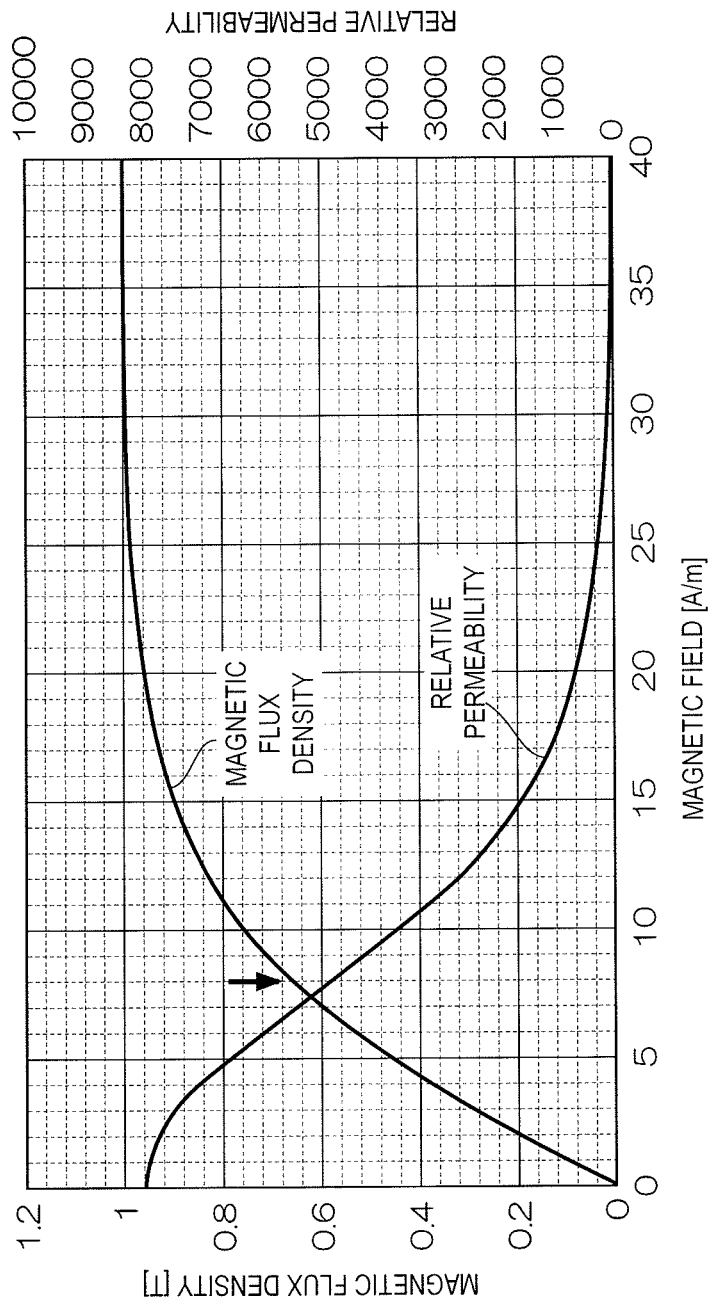
FIG. 3 is a graph illustrating a B-H curve and relative permeability.

FIG. 3 illustrates a B-H curve and relative permeability of the core 10, and the DC current to be applied to the coils 21, 22 is set to generate, for example, a DC magnetic field of approximately 8 A/m. The value of the magnetic field, 8 A/m, is placed almost at the middle in a region where the relative permeability changes linearly relative to the magnetic field.

The coils 21, 22 are assumed to have an identical number of turns, and an inductance L1 of the coil 21 and an inductance L2 of the coil 22 are equal. At a connection point P of the coil 21 and the coil 22, an AC voltage with a superimposed DC voltage is generated by the excitation power supply 30 including the DC power supply 31 and the AC power supply 32. An AC voltage Vd at the connection point P is expressed by the following, where Vac is an AC excitation voltage of the excitation power supply 30:

$$Vd = (L2/(L1+L2)) \cdot Vac \tag{1}$$

and the inductances L1, L2 of the coil 21 and the coil 22 are equal when the external magnetic field is 0, so that the AC voltage Vd at the connection point P becomes ½ of the AC excitation voltage Vac.

In the meanwhile, when the earth magnetism M passes through the core 10 as illustrated in FIG. 1, magnetic flux proportional to the earth magnetism M is generated in the portions of the core 10 where the coils 21, 22 are placed. This causes the DC magnetic flux to be enhanced by each other in the portion where the coil 22 is placed and the DC magnetic flux to cancel each other in the portion where the coil 21 is placed. Therefore, magnetic flux density inside the core 10 in the portion where the coil 21 is placed changes and magnetic flux density inside the core 10 in the portion where the coil 22 is placed also changes.

When the magnetic flux density changes, as understood from FIG. 3, the relative permeability of the core 10 changes. Since the magnetic flux density at the portion where the coil 22 is placed increases, the relative permeability decreases, whereas since the magnetic flux density at the portion where the coil 21 is placed decreases, the relative permeability increases. In response to each change of the relative permeability, the inductance L2 of the coil 22 decreases and the inductance L1 of the coil 21 increases. Accordingly, from the formula (1), the AC voltage Vd at the connection point P becomes less than the value assumed when the external magnetic field is 0, that is, Vd becomes less than ½ of the AC excitation voltage Vac.

As seen from the above, the AC voltage Vd at the connection point P of the two coils 21, 22 changes depending on the input of the earth magnetism (external magnetic field), so that detection of the AC voltage Vd at the connection point P enables measurement of the earth magnetism.

A detection circuit 40 is connected to the connection point P of the coils 21, 22. The detection circuit 40 in this embodiment includes, as illustrated in FIG. 2, a synchronous detector 41 and a low pass filter 42. The synchronous detector 41 synchronously detects the voltage at the connection point P using the AC excitation voltage Vac of the excitation power supply 30. The low pass filter 42 smooths an output of the synchronous detector 41. The synchronously detected voltage becomes an output Vo after passing through the low pass filter 42.

The detection circuit 40 is supposed to obtain the output Vo in such a manner. It is possible to measure the earth magnetism by the output Vo because the output Vo is responsive (proportional) to the magnitude of the earth magnetism.

As described above, in this embodiment, unlike the conventional flux gate type geomagnetic sensor, it is not required to excite the core 10 until the core is magnetically saturated, that is, the core 10 is not supposed to be magnetically saturated. Accordingly, the excitation current (DC current) may be small and the amplitude of the AC excitation voltage may also be small, thereby making it possible to reduce power consumption compared with the conventional flux gate type geomagnetic sensor.

Figure 4:
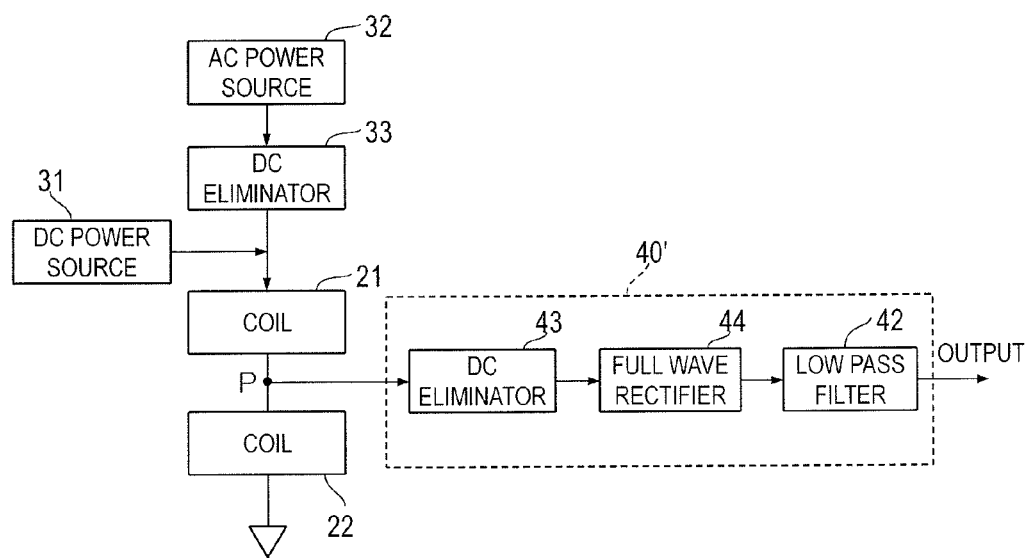
FIG. 4 is a block diagram illustrating a functional configuration in a second embodiment of a geomagnetic sensor according to the present invention.

FIG. 4 illustrates a functional configuration in a second embodiment of a geomagnetic sensor according to the present invention as a block diagram, and in this embodiment, a detection circuit 40' is configured with a DC eliminator 43 that removes a DC component from the voltage at the connection point P of the coils 21, 22, a full wave rectifier 44 that rectifies the full wave of an output of the DC eliminator 43, and a low pass filter 42 that smooths an output of the full wave rectifier 44. Instead of the detection circuit 40 illustrated in FIG. 2, it is also possible to employ the detection circuit 40' of this type. The configuration may also use a half wave rectifier instead of the full wave rectifier 44.

Figure 5:
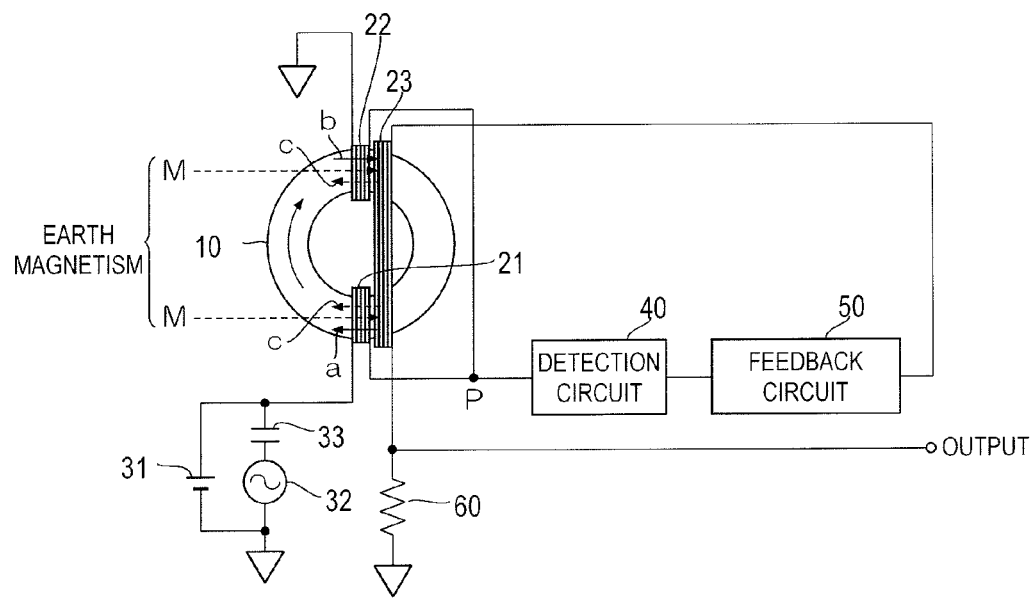
FIG. 5 is a diagram schematically illustrating a configuration in a third embodiment of a geomagnetic sensor according to the present invention.
Figure 6:
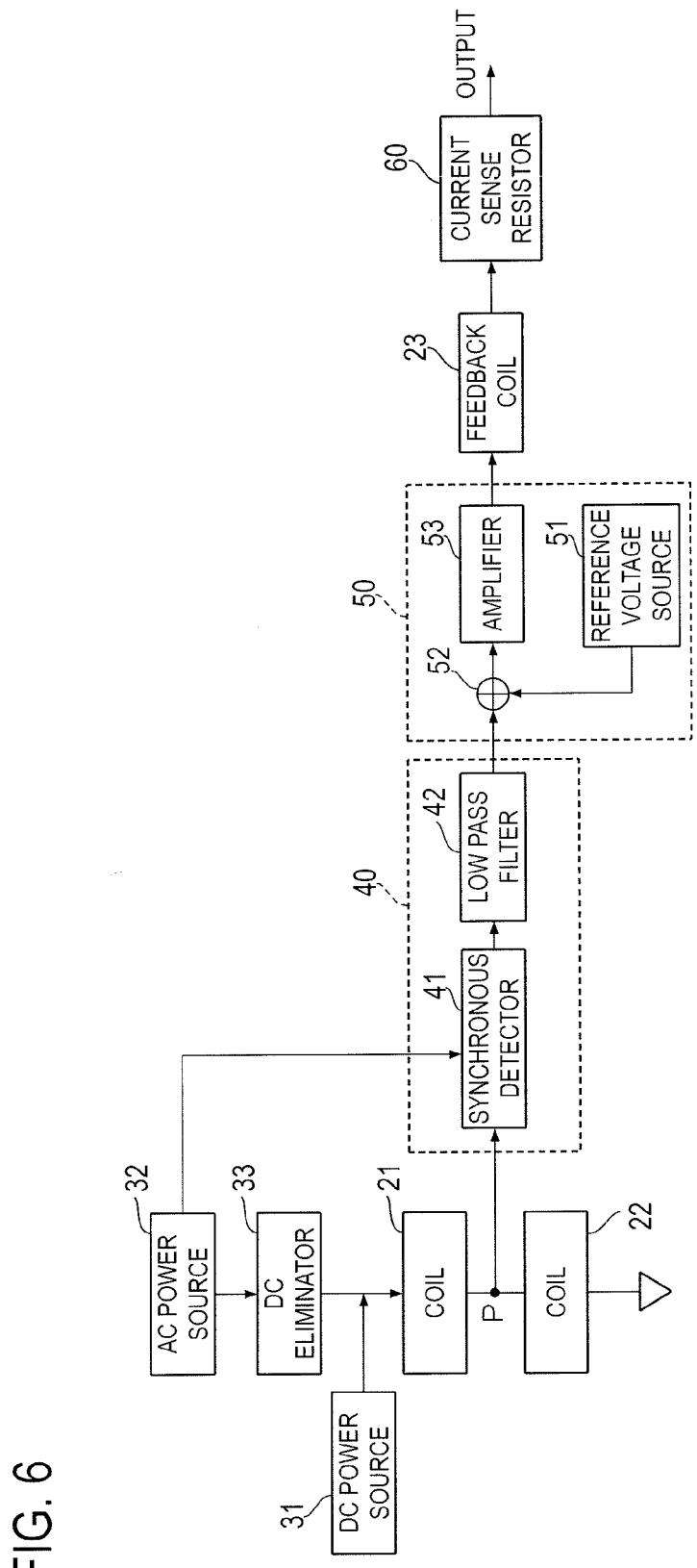
FIG. 6 is a block diagram illustrating a functional configuration in the third embodiment of a geomagnetic sensor according to the present invention.

Next, descriptions are given to a third embodiment of a geomagnetic sensor according to the present invention. FIG. 5 schematically illustrates a configuration in the third embodiment, and FIG. 6 illustrates a functional configuration of the third embodiment as a block diagram.

Relative to the configuration illustrated in FIG. 1 and FIG. 2, a feedback coil 23, a feedback circuit 50, and a current sense resistor 60 are added in this embodiment.

The feedback coil 23 is wound around the core 10 to make the core 10 magnetically-equilibrated. As illustrated in FIG. 5, the feedback coil 23 is preferably disposed such that magnetic flux generated by the feedback coil 23 is parallel to the external magnetic field (the earth magnetism M). In FIG. 5, an arrow c denotes a direction of the magnetic flux generated by the feedback coil 23.

The feedback circuit 50 is connected to a subsequent stage of the detection circuit 40. The feedback circuit 50 includes a reference voltage source 51 to generate a reference voltage, an adder 52 to add an output of the detection circuit 40 (output of the low pass filter 42) and the reference voltage, and an amplifier 53 to amplify the output of the adder 52 and flow a feedback current to the feedback coil 23.

The current sense resistor 60 converts the feedback current flowing through the feedback coil 23 to a voltage and outputs the voltage.

The reference voltage generated by the reference voltage source 51 is set up to cancel an output voltage output from the low pass filter 42 to 0 V when the external magnetic field is 0. Accordingly, the feedback current becomes 0 when the external magnetic field is 0, and a current does not flow through the feedback coil 23. An output of the current sense resistor 60 becomes 0 V.

In the meanwhile, when the earth magnetism M is input as illustrated in FIG. 5, the output of the low pass filter 42 becomes less than the output assumed when the external magnetic field is 0, as described in the first embodiment. Accordingly, the output of the adder 52 becomes a negative voltage. This causes a negative feedback current to flow through the feedback coil 23, and the core 10 becomes a magnetic equilibrium state relative to the earth magnetism M. The feedback current is converted to a voltage by the current sense resistor 60 and then the voltage is output, and it is possible to measure the input earth magnetism in this embodiment by the output of the current sense resistor 60. The detection circuit 40 may also be replaced with the detection circuit 40'.

Although embodiments of the present invention have been described above, the core 10 is not limited to a toroidal core and may also be in another shape, and for example, may also be a core in a quadrilateral shape. In addition, instead of the DC power supply 31, a DC constant current source may also be used.

What is claimed is:
1. A geomagnetic sensor, comprising:
a core that constitutes a closed magnetic circuit;
two coils that are wound around the core in positions facing each other and that are connected in series to generate magnetic flux in a same circumferential direction in the core;
an excitation power supply that applies an alternating current with a superimposed direct current to the two coils; and
a detection circuit that is connected to a connection point of the two coils,
wherein the detection circuit includes a synchronous detector that synchronously detects a voltage at the connection point using an alternating current excitation voltage of the excitation power supply, and a low pass filter that smooths an output of the synchronous detector.

2. The geomagnetic sensor according to claim 1, further comprising:
a feedback coil;
a feedback circuit; and
a current sense resistor,
wherein the feedback coil is wound around the core to make the core magnetically equilibrated,
the feedback circuit includes a reference voltage source to generate a reference voltage, an adder to add an output of the low pass filter and the reference voltage, and an amplifier to amplify an output of the adder and flow a feedback current to the feedback coil, and
the feedback current is converted to a voltage by the current sense resistor and then the voltage is output.

3. A geomagnetic sensor, comprising:
a core that constitutes a closed magnetic circuit;
two coils that are wound around the core in positions facing each other and that are connected in series to generate magnetic flux in a same circumferential direction in the core;
an excitation power supply that applies an alternating current with a superimposed direct current to the two coils; and
a detection circuit that is connected to a connection point of the two coils,
wherein the detection circuit includes a direct current eliminator that removes a direct current component of a voltage at the connection point, a full wave rectifier that rectifies full wave of an output of the direct current eliminator, and a low pass filter that smooths an output of the full wave rectifier.

4. The geomagnetic sensor according to claim 3, further comprising:
a feedback coil;
a feedback circuit; and
a current sense resistor,
wherein the feedback coil is wound around the core to make the core magnetically equilibrated,
the feedback circuit includes a reference voltage source to generate a reference voltage, an adder to add an output of the low pass filter and the reference voltage, and an amplifier to amplify an output of the adder and flow a feedback current to the feedback coil, and
the feedback current is converted to a voltage by the current sense resistor and then the voltage is output.

5. A geomagnetic sensor, comprising:
a core that constitutes a closed magnetic circuit;
two coils that are wound around the core in positions facing each other and that are connected in series to generate magnetic flux in a same circumferential direction in the core;
an excitation power supply that applies an alternating current with a superimposed direct current to the two coils; and
a detection circuit that is connected to a connection point of the two coils,
wherein the detection circuit includes a direct current eliminator that removes a direct current component of a voltage at the connection point, a half wave rectifier that rectifies half wave of an output of the direct current eliminator, and a low pass filter that smooths an output of the half wave rectifier.

6. The geomagnetic sensor according to claim 5, further comprising:
a feedback coil;
a feedback circuit; and
a current sense resistor,
wherein the feedback coil is wound around the core to make the core magnetically equilibrated,
the feedback circuit includes a reference voltage source to generate a reference voltage, an adder to add an output of the low pass filter and the reference voltage, and an amplifier to amplify an output of the adder and flow a feedback current to the feedback coil, and
the feedback current is converted to a voltage by the current sense resistor and then the voltage is output.

7. A geomagnetic sensor, comprising:
a core that constitutes a closed magnetic circuit;
two coils that are wound around the core in positions facing each other and that are connected in series to generate magnetic flux in a same circumferential direction in the core;
an excitation power supply that applies an alternating current with a superimposed direct current to the two coils; and
a detection circuit that is connected to a connection point of the two coils,
wherein the excitation power supply applies the alternating current with the superimposed direct current to the two coils in a manner such that the core is not magnetically saturated.

8. The geomagnetic sensor according to claim 7,
wherein the superimposed direct current is set so as to generate a magnetic field corresponding to a midpoint of a range in which relative permeability changes linearly with response to a magnetic field.

9. A geomagnetic sensor, comprising:
a core that constitutes a closed magnetic circuit;
two coils that are wound around the core in positions facing each other and that are connected in series to generate magnetic flux in a same circumferential direction in the core;
an excitation power supply that applies an alternating current with a superimposed direct current to the two coils; and
a detection circuit that is connected to a connection point of the two coils,
wherein the superimposed direct current is set so as to generate a magnetic field corresponding to a midpoint of a range in which relative permeability changes linearly with response to a magnetic field.

* * * * *